(12) United States Patent
Takahashi et al.

(10) Patent No.: US 6,375,406 B1
(45) Date of Patent: *Apr. 23, 2002

(54) APPARATUS FOR TRANSPORTING PARTS

(75) Inventors: Shigeki Takahashi; Nihei Kaishita; Akira Nemoto, all of Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/307,773

(22) Filed: May 10, 1999

(30) Foreign Application Priority Data

May 15, 1998 (JP) .......................... 10-133063

(51) Int. Cl.$^7$ .............................. B65G 59/00

(52) U.S. Cl. ................. 414/798.9; 414/798.2; 414/798.3; 414/798.6; 221/248; 198/459.6; 198/463.4

(58) Field of Search ............... 414/798.9, 789.9, 414/798.2, 798.3, 798.6; 221/248; 198/459.6, 463.4, 390, 451.9

(56) References Cited

U.S. PATENT DOCUMENTS

| 4,355,712 A | * 10/1982 | Bruno | 198/460 |
| 5,503,299 A | 4/1996 | Smith | |
| 5,836,437 A | * 11/1998 | Saito et al. | 198/396 |
| 6,032,783 A | * 3/2000 | Saito et al. | 189/390 |

FOREIGN PATENT DOCUMENTS

| EP | 0 683 625 | 11/1995 |
| JP | 10-133063 | 5/1998 |

OTHER PUBLICATIONS

Patent Abstracts of Japan, vol. 096, No. 006, Jun. 28, 1996, Abstract No. 08–048419.

* cited by examiner

Primary Examiner—Joseph A. Fischetti
(74) Attorney, Agent, or Firm—Burns, Doane, Swecker & Mathis, LLP

(57) ABSTRACT

A part transporting apparatus comprises: a guiding groove for lining up parts in one row and guiding the parts; a transporting member which is provided at the base of the guiding groove and transports the parts in a forward direction by itself moving forwards and backwards along the groove; and a driving means for reciprocally driving the transporting member in the forward and backward directions; wherein the transporting member is advanced slowly and retracted rapidly, so as to transport the parts forwards. Provided to this arrangement are: a stopper which operates so as to open and close in the width direction of the guiding groove, and hold the second part from the front of the row of parts being transported on the upper plane of the transporting member; and a synchronizing means for opening and closing the stopper synchronously with the reciprocal forward and backward movement of the transporting member; wherein, once the stopper holds the second part, the transporting member further moves forward, thereby separating the first part in the row from the second part. Such an arrangement provides for an apparatus for transporting parts, wherein the first part and second part can be separated in a sure manner even in the event that the parts are non-magnetic material, and wherein ease of extracting of the first part is facilitated.

18 Claims, 10 Drawing Sheets

APPARATUS FOR TRANSPORTING PARTS

BACKGROUND OF THE INVENTION

1. Field of the Invention

The present invention relates to an apparatus for transporting parts, and particularly relates to an apparatus for transporting parts which separates the first part in a row of parts being transported from the second part in this row.

2. Description of the Related Art

Regarding apparatuses for transporting small parts such as chip parts, an apparatus is known wherein an endless belt comprises the bottom of a transporting groove through which parts are guided, and wherein the parts are transported by means of intermittent driving of this belt (see Japanese Unexamined Patent Publication No. 8-48419). In the case of this apparatus, a mechanism is provided for separating the first part in the row on the belt from the second part in the row, so as to allow the first part in the row to be extracted therefrom. This separating mechanism acts so that a stopper is brought into contact with the front-most end of a guiding groove at the time that the parts on the belt move forward with the forward motion of the belt, the first part is stopped at a certain position, and upon the first part coming into contact with the stopper so that motion of all parts is stopped, the second part is held in the same position by a holding pin while the stopper is opened forwards so as to allow the first part to proceed forward while remaining in the state of being attached by a permanent magnet on the stopper, thereby forcibly forming a gap between the first part and the second part.

However, this method in the above separating mechanism involves stopping the movement of all parts, attaching the first part by a permanent magnet provided in the stopper, and pulling this part forward by magnetic force, meaning that the parts cannot be separated in the event that the part is formed of a non-magnetic material, or that debris or the like is on the part such that magnetism does not effectively work. Also, friction occurs between the part and belt at the time of extracting the first part, so there is the possibility that the attachment between the permanent magnet and the part may be separated. Thus, such an arrangement has the problem of being unreliable.

SUMMARY OF THE INVENTION

Accordingly, it is an object of the present invention to provide an apparatus for transporting parts, wherein the first part and second part can be separated in a sure manner even in the event that the parts are non-magnetic material, and wherein ease of extracting of the first part is facilitated.

In order to achieve the above object, a part transporting apparatus comprises: a guiding groove for lining up parts in one row and guiding the parts; a transporting member which is provided at the base of the guiding groove and transports the parts in a forward direction by itself moving forwards and backwards along the groove; driving means for reciprocally driving the transporting member in the forward and backward directions; a stopper which operates so as to open and close in the width direction of the guiding groove, and hold the second part from the front of the row of parts being transported on the upper plane of the transporting member; and synchronizing means for opening and closing the stopper synchronously with the reciprocal forward and backward movement of the transporting member; wherein, once the stopper holds the second part, the transporting member moves forward by a certain distance, thereby separating the first part in the row and the second part.

FIGS. 1A through 1E illustrate the operation principle of the part transporting mechanism according to the present invention.

FIG. 1A is the initial position, with both sides of the parts P being guided by a guiding groove (not shown), and thereby arrayed in a single row. A transporting member M capable of moving forwards and backwards is provided to the bottom plane of the guiding groove. The parts P ride on the upper surface of the transporting member M, and an opened stopper S is located by the side of the first part $P_1$. In this drawing, the stopper S is positioned above the parts P, but in actual use is positioned to the side of the parts P (in the direction perpendicular to the surface of the drawing).

FIG. 1B shows the transporting member M in a state of having been moved forward by one pitch. At this point, the stopper S is operated in the closing direction, the second part $P_2$ is pressed against the inside of the guiding groove and thus held, thereby preventing forward movement of the second and subsequent parts.

FIG. 1C shows the transporting member M in a state of having been moved further forward. Here, the first part $P_1$ moves forward with the forward movement of the transporting member M, but the second and subsequent parts P are restrained by the stopper S, so relative slippage is generated between the transporting member M and the second and subsequent parts P. Consequently, a gap δ is generated between the first part $P_1$ and second part $P_2$.

FIG. 1D shows an extracting device K such as a mounter or the like being used to extract the first part $P_1$. At this time, a gap δ is provided between the first part $P_1$ and second part $P_2$, so there is no danger of the second part $P_2$ being accidentally extracted.

FIG. 1E shows the transporting member M in a state of having been moved backwards. At this point, some sort of means is provided to prevent the parts P from moving backwards with the transporting member M. Consequently, relative slippage is generated between the transporting member M and the parts P, so the transporting member M alone moves forward and the parts P are maintained at the progressed position.

Repeating the operation shown in FIGS. 1A through 1E intermittently transports the row of parts P forward, and sequentially extracts the first part $P_1$ one at a time.

Regarding the method of transporting the parts in one direction with the transporting member, it is preferable that friction is used. That is, the driving means may drive the transporting member in a reciprocal manner such that the speed of moving in the backward direction is greater than the speed of moving in the forward direction. The speed of moving in the forward direction is a speed at which holding friction acts between the transporting member and the parts disposed upon the upper surface thereof; and the speed of moving in the backward direction is a speed at which the friction between the transporting member and the parts disposed upon the upper surface thereof is essentially broken. With such an arrangement, the parts can be transported in one direction simply by reciprocal driving of the transporting member, so the transporting mechanism can be simplified, and further, the parts are not restrained, so there is little damage inflicted upon the parts. Incidentally, the term "the friction . . . is essentially broken" includes not only speeds at which friction does not act at all, but also speeds at which the parts do not actually move backwards even if friction does act.

Also, the synchronizing means may comprise: a first groove provided in a diagonal manner to the tip portion of the transporting member; a second groove provided in a vertical manner on the inner surface of a fixing member for guiding the side of the transporting member; a rolling member fitted to the first groove and the second groove so as to straddle the space therebetween; an inclined plane formed on the stopper, coming into contact with the rolling member; and a spring pressing for the stopper in the direction of holding parts. With this arrangement, the rolling member moves vertically along the first and second grooves owing to the reciprocating action of the transporting member in the forward and backward directions, and the rolling member moves along the inclined plane provided to the stopper, so that the stopper reciprocally moves in the width direction of the guiding groove, thereby holding the second part from the front of the row of parts.

In this case, the rolling member is used to comprise the synchronizing means, so movement is smooth and the mechanism is durable. Also, the stopper is moved synchronously with the movement of the transporting member, so the timing between holding the second part and forward movement of the transporting member is easily synchronized, and the reliability of operating is high.

Also, the synchronizing means may comprise: a contacting portion provided to the transporting member; an inclined plane formed on the stopper, the portion thereof coming into contact with the contacting portion in the forward and backward directions; and a spring for pressing the stopper in the direction of holding parts. With this arrangement, the contacting portion moves along the inclined plane of the stopper owing to the reciprocating action of the transporting member in the forward and backward directions, so that the stopper reciprocally moves in the width direction of the guiding groove, thereby holding the second part from the front of the row of parts.

Such an arrangement reduces the number of part and simplifies the structure.

Further, the synchronizing means may comprise: an inclined plane provided on the transporting member in the forward and backward direction; a contacting portion formed on the stopper, coming into contact with the inclined plane member; and a spring pressing for the stopper in the direction of holding parts. With this arrangement, the contacting portion of the stopper moves over the inclined plane owing to the reciprocating action of the transporting member in the forward and backward directions, so that the stopper reciprocally moves in the width direction of the guiding groove, thereby holding the second part from the front of the row of parts.

Such an arrangement also reduces the number of part and simplifies the structure, as with the above arrangement.

Also, the synchronizing means may comprise: a first groove provided in a diagonal manner to the tip portion of the transporting member; a second groove provided in a vertical manner on the inner surface of a fixing member for guiding the side of the transporting member; and a rolling member fitted to the first groove and the second groove so as to straddle the space therebetween. The stopper itself may be formed of a material having spring-like properties in the direction of holding parts. With this arrangement, the rolling member moves vertically along the first and second grooves owing to the reciprocating action of the transporting member in the forward and backward directions, and the rolling member moves along the inclined plane provided to the stopper, so that the stopper reciprocally moves in the width direction of the guiding groove, thereby holding the second part from the front of the row of parts.

This arrangement is of the same configuration as the synchronizing mechanism according to an earlier arrangement, but the stopper itself is formed of a spring-like member, so the spring is unnecessary, and thus the mechanism can be simplified.

Also, the stopper may be provided to one side of the guiding groove, with the stopper reciprocally moving in the width direction of the guiding groove, thereby holding the second part from the front of the row of parts. Or, the stopper may be provided to both sides of the guiding groove, with the stopper reciprocally moving in the width direction of the guiding groove, thereby holding the second part from the front of the row of parts.

DETAILED DESCRIPTION OF THE PREFERRED EMBODIMENTS

FIGS. 2 through 7 illustrate an example of the apparatus for transporting parts, according to the present invention. Incidentally, chip-type electronic parts are used as the parts P in this embodiment.

Figure 1A:
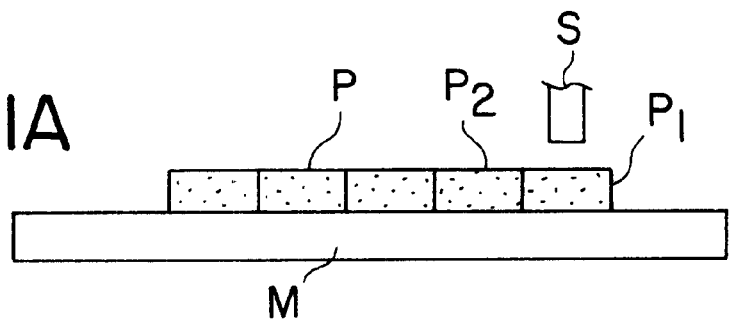
FIGS. 1A through 1E are explanatory diagrams illustrating the operating principle of the apparatus for transporting parts according to the present invention.
Figure 1B:
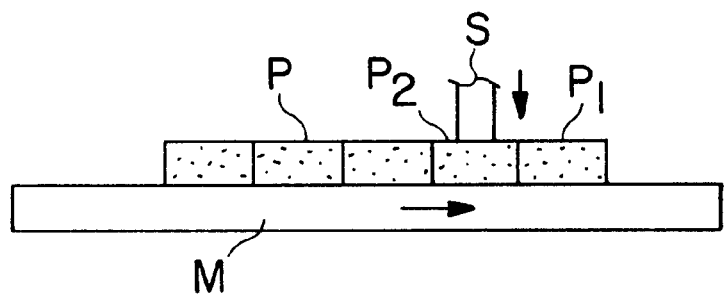
Figure 1C:
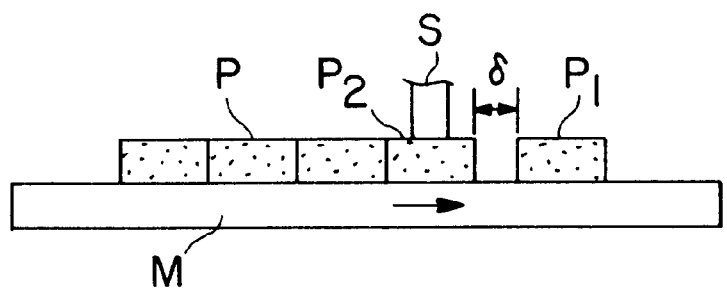
Figure 1D:
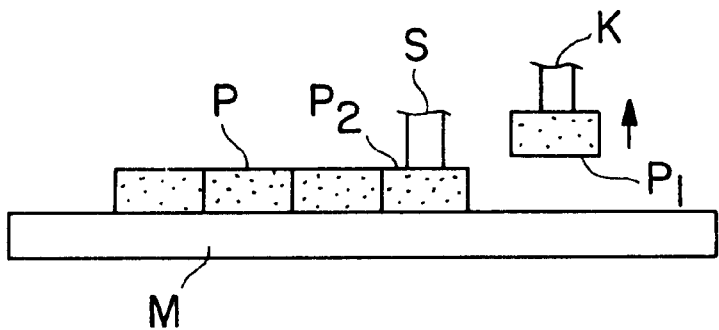
Figure 1E:
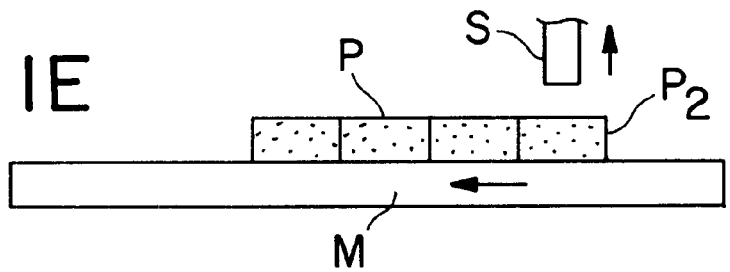
Figure 2:
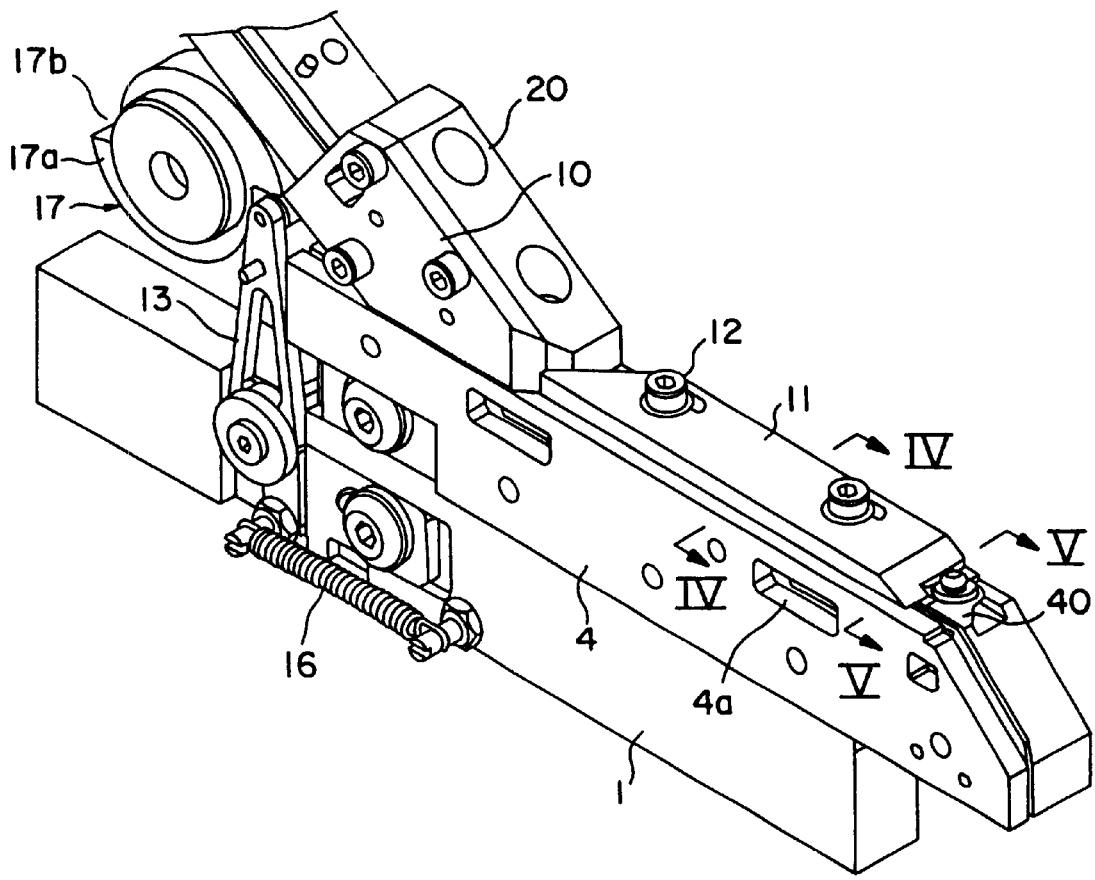
FIG. 2 is a perspective view of an example of the apparatus for transporting parts according to the present invention.
Figure 3:
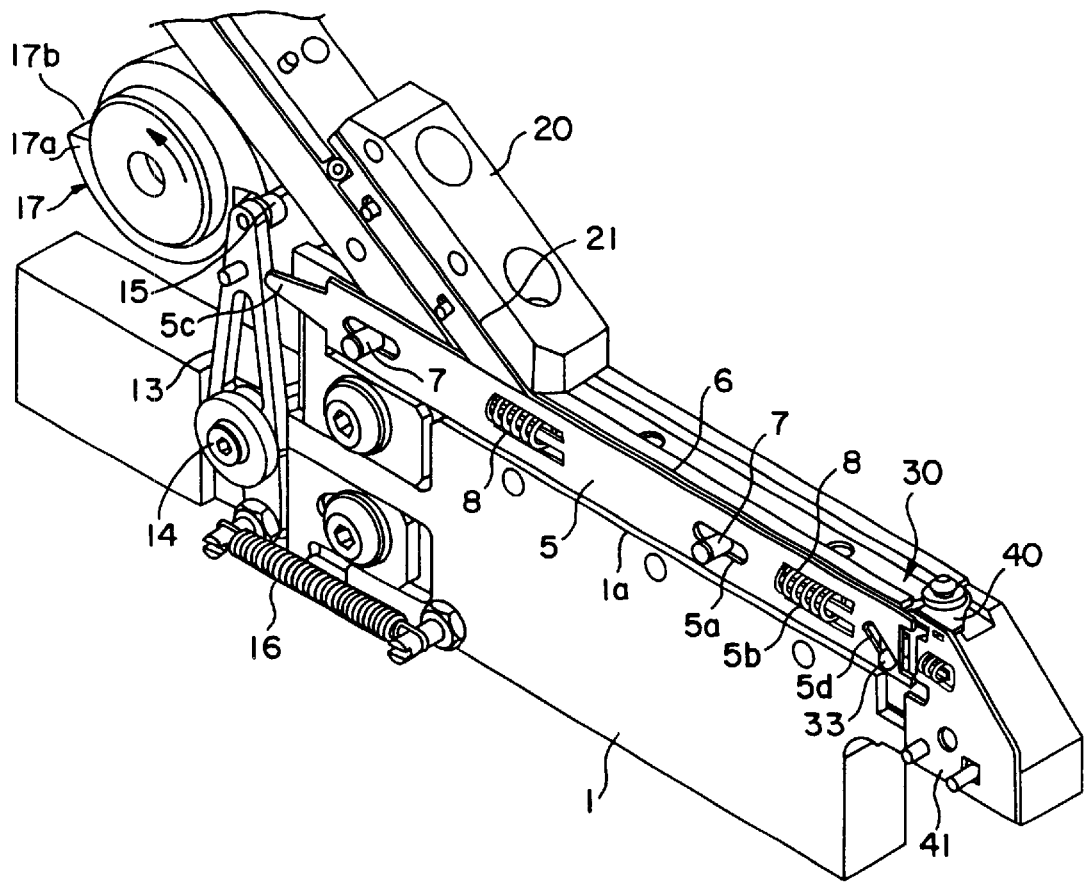
FIG. 3 is a perspective view of the apparatus for transporting parts shown in FIG. 2, with the front cover and upper cover removed.

FIG. 2 is an overall view of the apparatus, and FIG. 3 shows the state thereof with the later-described front covers 4 and 10, and the upper cover 11 removed.

Figure 4:
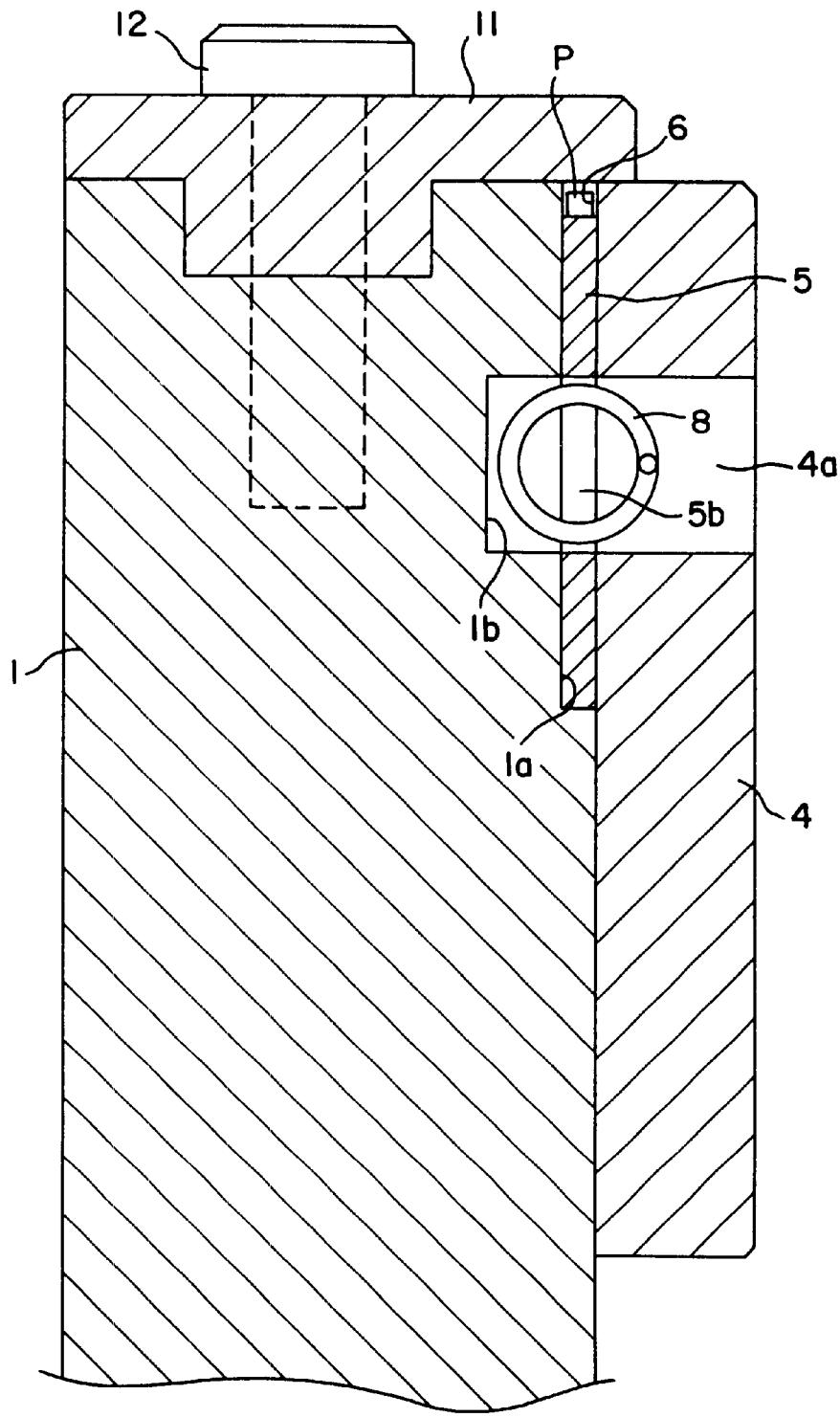
FIG. 4 is a cross-sectional diagram along line IV—IV in FIG. 2.

A recessed portion 1a is formed at the front of the apparatus proper 1, as shown in FIG. 4, and a narrow space is formed by fixing the front cover 4 to the front of the apparatus proper 1. A blade 5, which is an example of the transporting member, is positioned in this space so as to be slidable in the horizontal direction. A cover 11 is fixed to the upper face of the apparatus proper 1 by means of screws 12 so that the parts P do not fly out at the time of being transported. The inner face of the above recessed portion 1a, the inner face of the front cover 4, the upper plane of the blade 5, and the lower plane of the above upper cover 11, define a guiding groove 6 whereby the parts P are arrayed in one row and guided.

The blade 5 is formed of a thin metal plate, in which are formed elongated holes 5a which is elongated in the forwards/backwards direction, and spring storing holes 5b, as shown in FIG. 3. Guide pins 7 protruding from the apparatus proper 1 are inserted through the elongated holes 5a, thereby guiding the blade 5 in the forwards/backwards direction. Also, springs 8 are stored in the spring storing holes 5b, and both ends of the springs 8 in the radius direction thereof fit into a recessed portion 1b formed in the apparatus proper 1, and an opening 4a formed in the cover 4 (see FIG. 4). The back side of the spring 8 is supported by the spring storing hole 5b, and the front side thereof is supported by the recessed portion 1b and the opening 4a, so that the springs 8 constantly press the blade 5 in the backwards direction.

The back end portion 5c of the blade 5 comes into contact with the front face of an intermediate lever 13 that is attached to the apparatus proper 1 in a rockable manner, by the force of the springs 8. The center portion of the intermediate lever 13 is rockably supported by a bolt 14, a roller 15 which rotates against the perimeter of a cam 17 is attached to the upper end thereof. A spring 16 has one end attached to the apparatus proper 1, and the other end thereof is attached to the lower end of the intermediate lever 13. Accordingly, the intermediate lever 13 is pressed in a direction such that the roller 15 at the upper end thereof comes into contact with the perimeter of the cam 17. The above springs 8, intermediate lever 13, and cam 17 comprise the driving means for reciprocally driving the blade 5.

As shown in FIGS. 2 and 3, the cam 17 has a raised portion 17a and a lowered portion 17b, and is rotated in the direction indicated by the arrow at a constant speed, by mean of a motor not shown in the drawings. Owing to such an arrangement, the blade 5 advances at a slow speed in accordance with the roller 15 of the intermediate lever 13 riding up on the raised portion 17a of the cam 17, and the blade 5 rapidly retreats in accordance with the roller 15 dropping into the lowered portion 17b of the cam 17. The speed at which the above blade 5 advances depends on the inclination of the raised portion 17a of the cam 17 and the speed of rotation of the cam 17, and is set to a speed such that a certain holding resistance acts between the blade 5 and the parts P on the upper plane thereof. Also, the speed at which the above blade 5 retreats is set to a speed such that the resistance between the blade 5 and the parts P on the upper plane thereof is essentially broken. In this way, the blade 5 is advanced at a slow speed so that friction acts, and is retracted at a fast speed so that friction is broken, so that the parts P can be transported in one direction without providing any particular mechanism for preventing the parts P from moving backwards.

An arraying device 20 for arraying the parts P in single file is provided to the upper side of the rear of the apparatus proper 1, this being fixed in a diagonal manner. A chute groove 21 is formed in the arraying device 20 so that the parts P follow the inclination thereof and slide down, with a front cover 10 covering the front side of this chute groove 21. The bottom end of this chute groove 21 is connected with the end portion of the guiding groove 6, so that the parts P which have slid down the chute 21 enter into the guiding groove 6. At this time, there is a change in angle between the chute 21 and the guiding groove 6, thereby serving to prevent parts P within the guiding groove 6 from returning, by means of the part P at the bottom of the chute groove 21.

A separating groove 30 for separating the first part in the row of parts being transported from the second part therein is provided at the front end of the guiding groove 6. As shown in FIGS. 5 through 7, the separating groove 30 has a stopper 31 for holding the second part $P_2$ in the row of parts P being transported along the surface of the blade 5, and synchronizing means 32 for rocking (opening/closing) the stopper in a manner synchronous with the forwards/backwards motion of the blade 5. The bottom end 31a of the stopper 31 is supported by a recessed portion 1c formed in the apparatus proper 1, and the stopper 31 is free to rock in the width friction of the guiding groove 6. The synchronizing means 32 in the present embodiment is provided to the tip of the blade 5, and is comprised of a first groove 5d inclined diagonally in the forwards/backwards direction, a second groove 4b formed vertically to the inner side of the front cover 4 for guiding the side of the blade 5, a ball 33 inserted so as to straddle the first groove 5d and the second groove 4b, a inclined plane 31b in the longitudinal direction which comes into contact with the ball 33, and a spring 34 which presses the stopper 31 in the direction of holding a part.

Figure 5A:
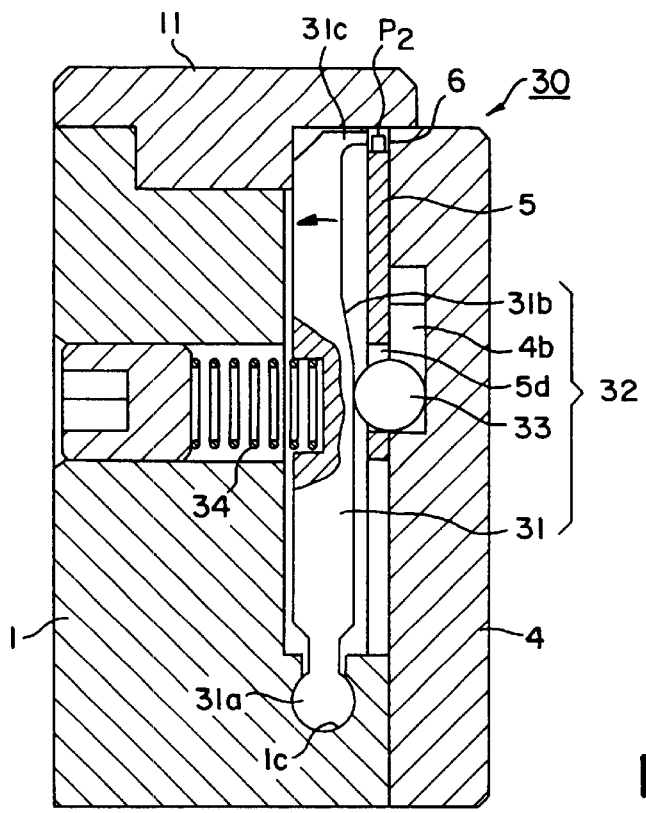
FIG. 5A is a cross-sectional diagram along line V—V in FIG. 2, with a part released.
Figure 6:
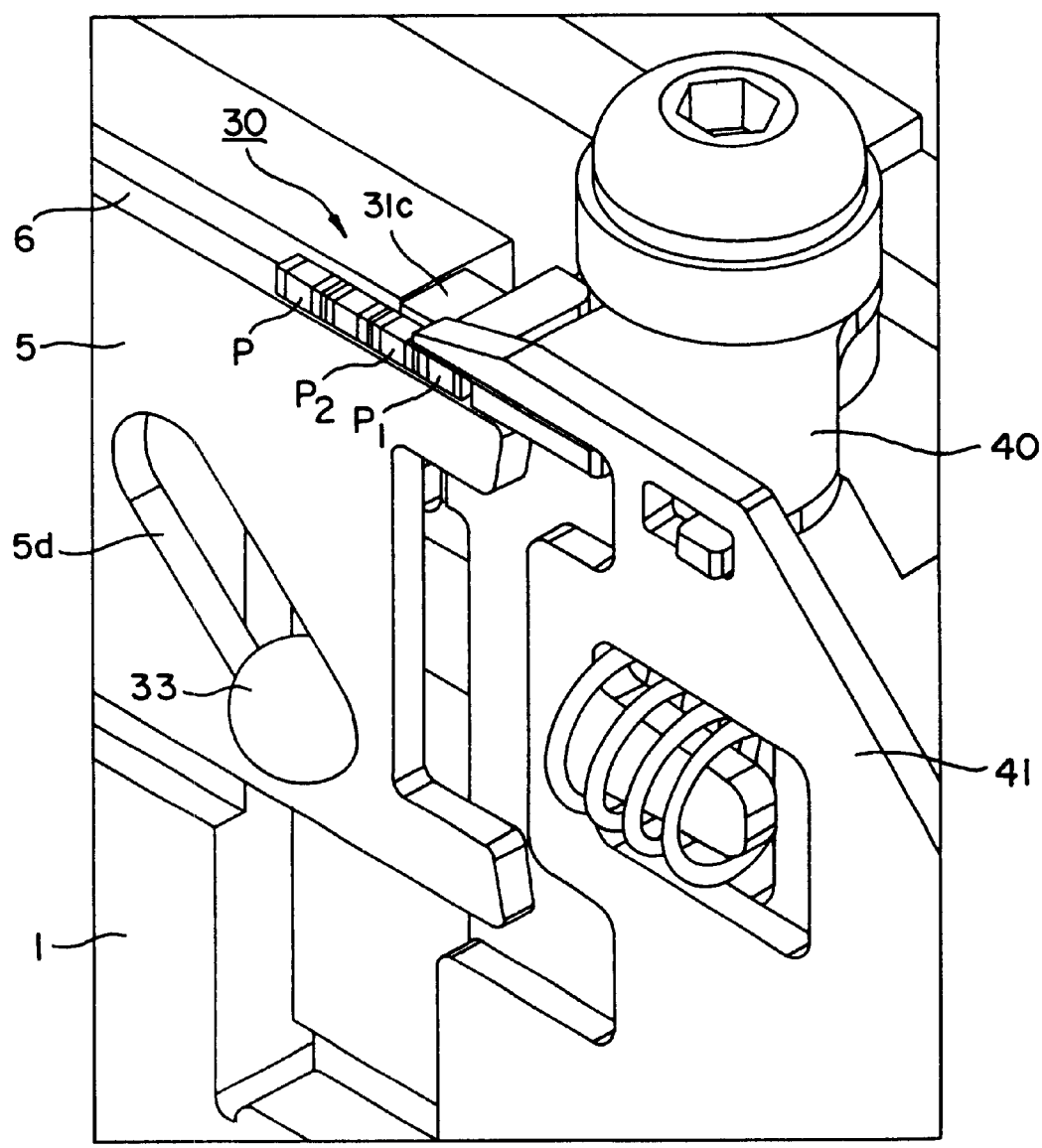
FIG. 6 is an enlarged perspective view of the separating mechanism, before separating.
Figure 7:
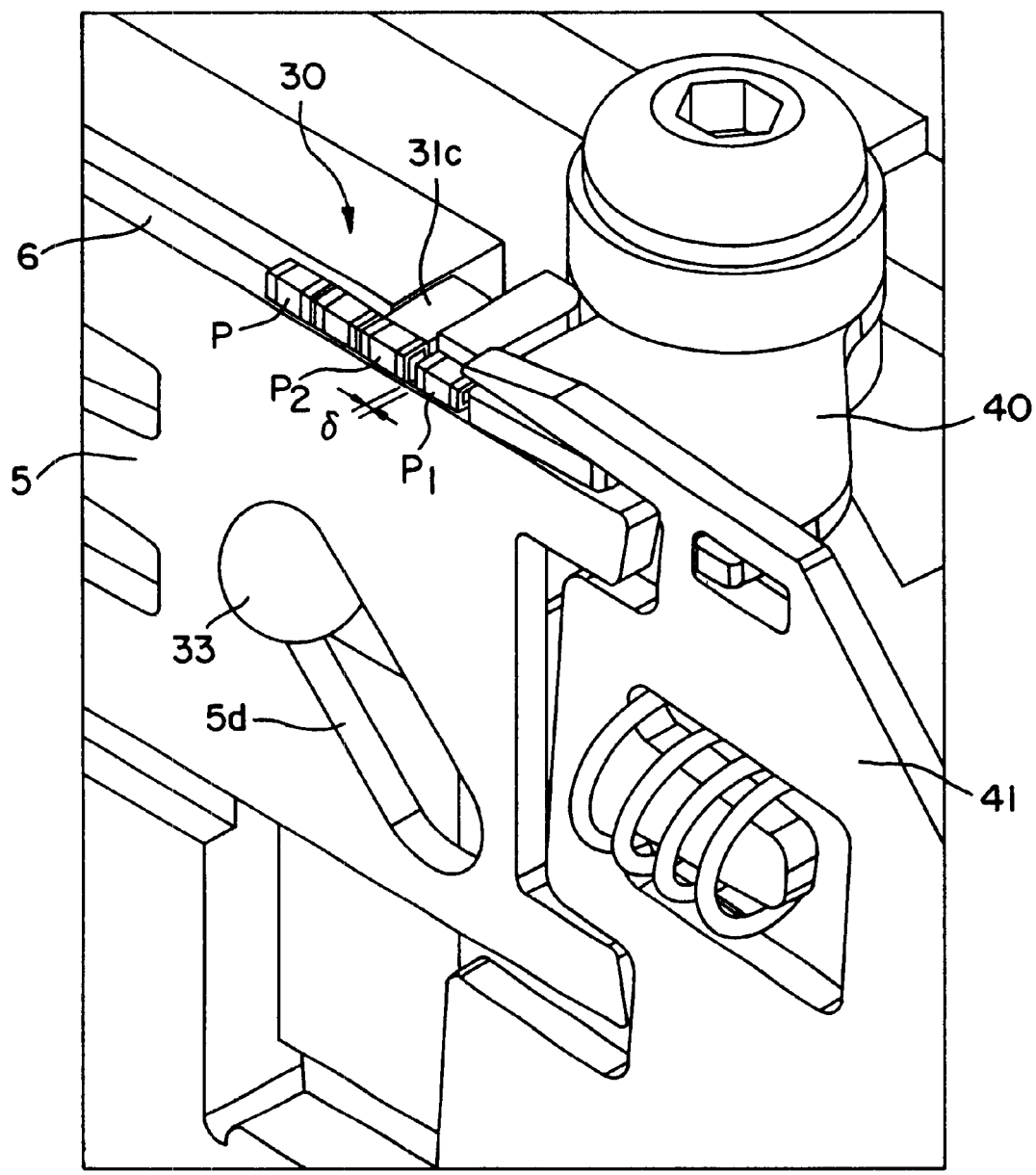
FIG. 7 is an enlarged perspective view of the separating mechanism, after separating.

When the blade 5 is at the retracted position, the ball 33 is at the lower end of the first groove 5d and second groove 4b, as shown in FIG. 5A and FIG. 6. Accordingly, the ball 33 is situated at a position lower than the inclined plane 31b of the stopper 31, pressing the stopper 31 in the direction of opening. Accordingly, the part $P_2$ within the guiding groove 6 is not held.

Figure 5B:
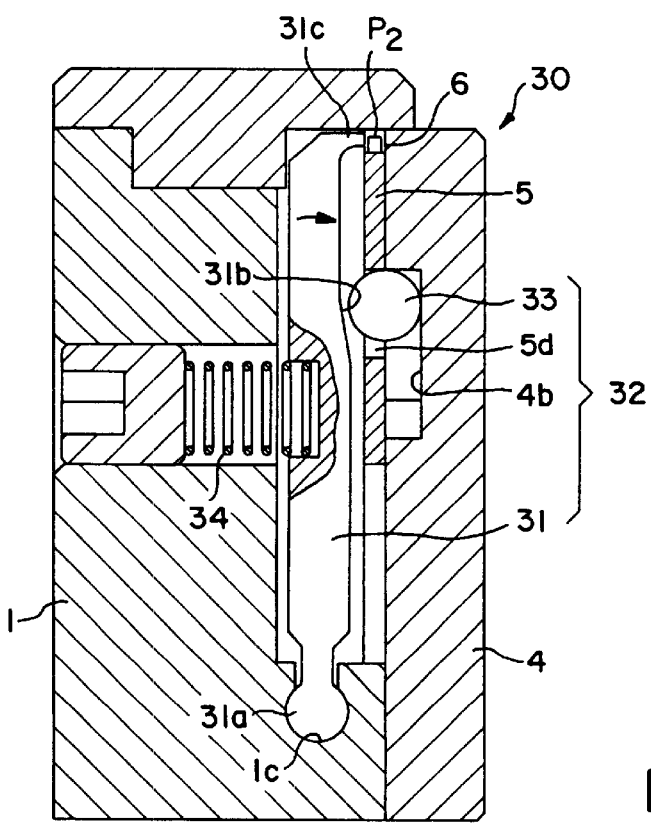
FIG. 5B is a cross-sectional diagram along line V—V in FIG. 2, with a part held.

When the blade moves forward, the difference in angle between the first groove 5d and second groove 4b causes the ball to move upwards as shown in FIG. 5B and FIG. 7, so that the ball 33 corresponds with the inclined surface 31b of the stopper 31. Accordingly, the force of pressing the stopper 31 open is disengaged, the stopper 31 rocks in the direction of closing by means of the spring 34, thereby the part $P_2$ is held between the tip portion 31c of the stopper 31 and the inner face of the guiding groove 6.

Further, when the blade 5 retreats, the difference in angle between the first groove 5d and second groove 4b causes the ball 33 to move downwards, the ball rides up on the inclined plane 31b of the stopper 31, thereby pressing open the stopper 31. Accordingly, the part $P_2$ within the guiding groove 6 can move freely.

As shown in FIGS. 2 and 3, also provided to the tip portion of the guiding groove 6 are: a movable stopper which presses the first part $P_1$ back so as to secure a gap σ between the first part $P_1$ and the second part $P_2$ in the event that an error occurs in extracting the first part $P_1$ for some reason; and a shutter 41 for closing the guiding groove 6 off above the part $P_1$ at the time of extracting the part $P_1$ therefrom.

Figure 8A:
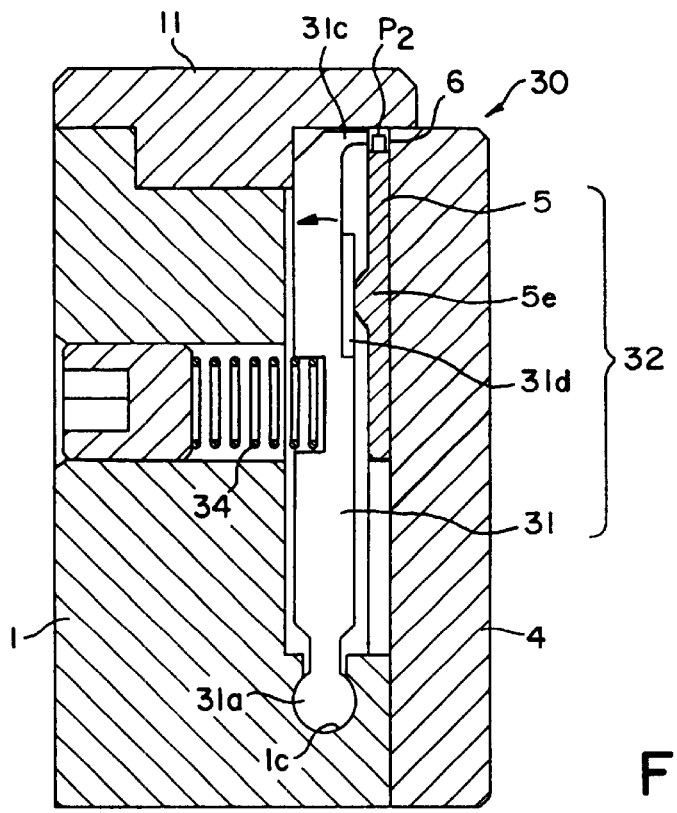
FIGS. 8A and 8B are cross-sectional views of the separating mechanism according to a second embodiment.
Figure 8B:
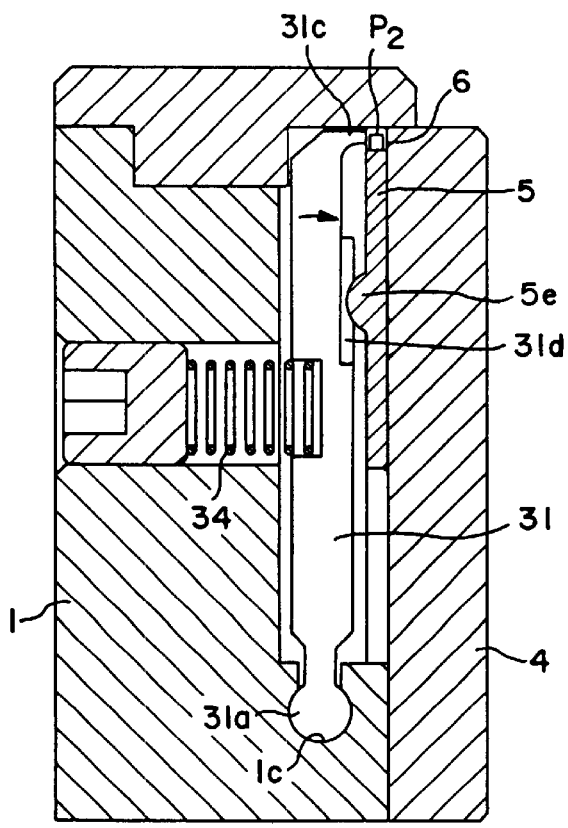

FIGS. 8A and 8B show a second embodiment of the separating mechanism 30 according to the present invention. The members which are the same as those shown in the first embodiment (FIG. 5) will be denoted with the same reference numerals and description thereof will be omitted.

In this embodiment, an inclined plane 31d in the backwards/forwards directions formed on the side of the stopper 31 which faces the blade 5, and a protrusion-shaped contacting portion 5e coming into contact with the inclined plane 31d is provided to the blade 5. In the event that the blade is at the retracted position, the contacting portion 5e is at the apex of the inclined plane 31d as shown in FIG. 8A. In the event that the blade 5 advances, the contacting portion 5e descends to the bottom of the inclined plane 31d, thereby rocking the stopper 31 so as to hold the part $P_2$ between the tip portion 31c thereof and the inner face of the guiding groove 6., as shown in FIG. 8B.

Figure 9A:
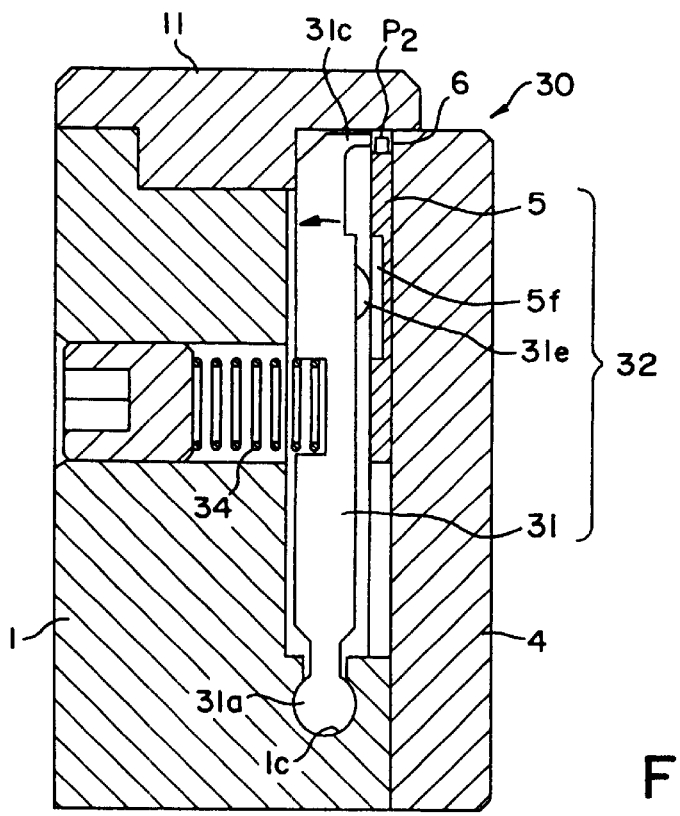
FIGS. 9A and 9B are cross-sectional views of the separating mechanism according to a third embodiment.
Figure 9B:
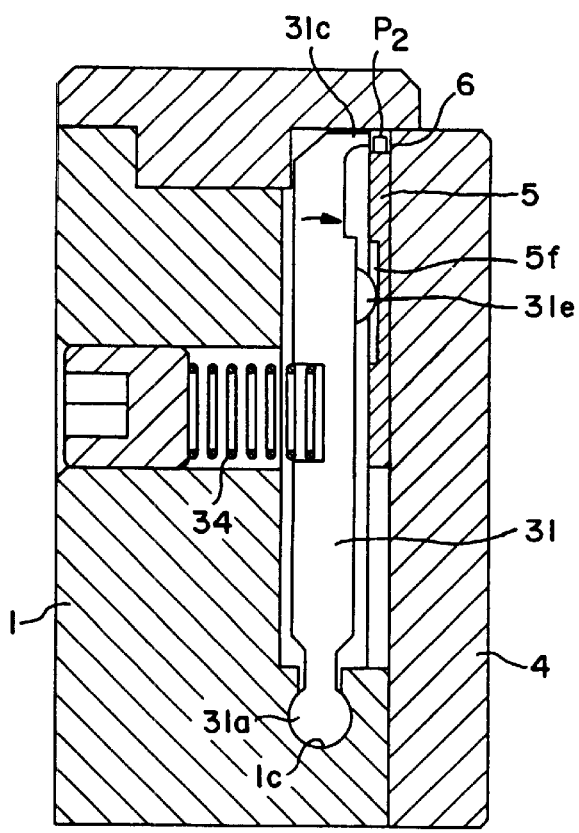

FIGS. 9A and 9B show a third embodiment of the separating mechanism 30 according to the present invention, wherein the relation between the inclined plane and contacting portion has been configured in a manner reverse to that of the second embodiment.

In the present embodiment, a contacting portion 31e is formed on the side of the stopper 31 which faces the blade 5, and an inclined plane 5f in the backwards/forwards direction is provided to the blade 5. FIG. 9A shows the blade in the retracted position, and FIG. 9B shows the blade in the advanced position. In this case also, the reciprocal movement of the blade 5 in the forward/backward directions moves the contacting portion 31e of the stopper 31 over the inclined plane 5f, whereby the stopper 31 moves reciprocally in the width direction of the guiding groove 6, consequently holding the second part $P_2$ in the row of parts.

Incidentally, in the embodiments shown in FIGS. 8A through 9B, the inclined plane 31d and contacting portion 31e of the stopper 31 are not necessarily formed directly out of the stopper 31; rather, a separate member may be attached to the stopper 31. In the same way, the contacting portion 5e and inclined plane 5f of the blade 5 are not necessarily formed directly out of the blade 5; rather, a separate member may be attached to the blade 5. Further, rolling members such as rollers or the like may be used for the contacting portions 5e and 31e, in order to reduce friction with the inclined planes 31d and 5f.

Figure 10A:
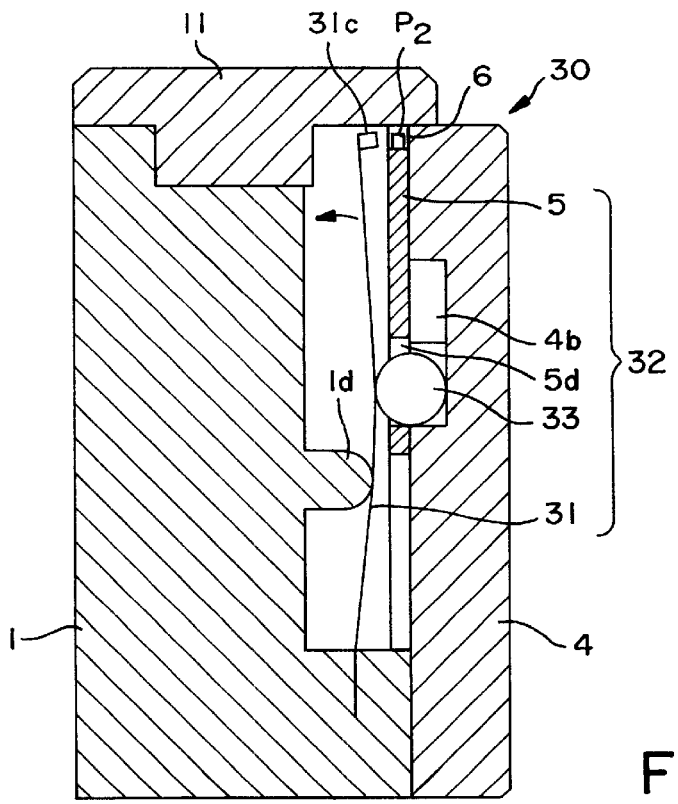
FIGS. 10A and 10B are cross-sectional views of the separating mechanism according to a fourth embodiment.
Figure 10B:
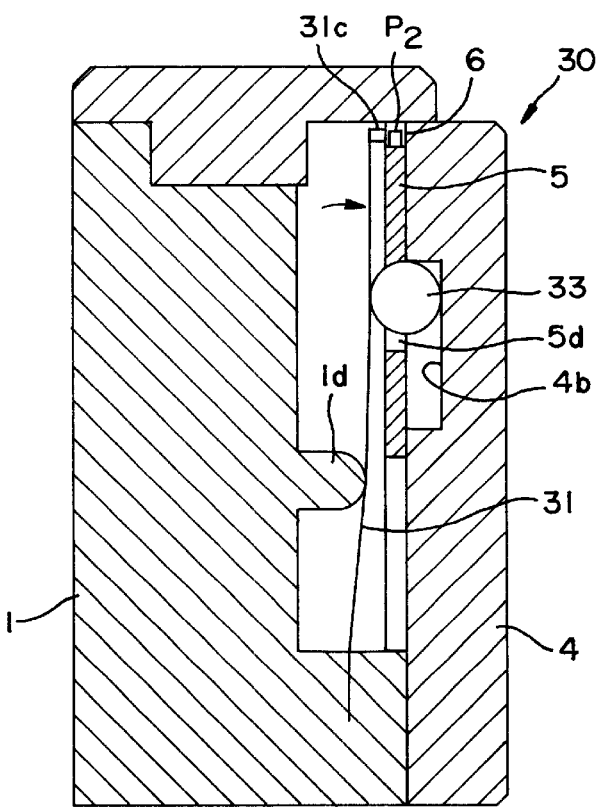

FIGS. 10A and 10B show a fourth embodiment of the separating mechanism 30 according to the present invention. The members which are the same as those shown in the first embodiment (FIG. 5) will be denoted with the same reference numerals and description thereof will be omitted.

The present embodiment consists of an arrangement wherein the stopper 31 is formed of a leaf spring, thereby omitting the spring 34. In this case, a protrusion 1d is formed on the apparatus proper 1 in order to provide the stopper 31 with spring force in the direction of the blade 5.

In this case, as with the case of the first embodiment, the ball 33 inserted so as to straddle the first groove 5d of the blade 5 and the second groove 4b of the front cover 4 acts to flex the stopper 31 so as to move the tip portion 31c of the stopper 31 in the width direction of the guiding groove 6, thereby holding the part $P_2$ between the tip portion 31c and the inner face of the guiding groove 6.

Incidentally, this stopper 31 formed of a leaf spring is not restricted to the arrangement shown in FIG. 10; rather, this may be applied to other embodiments, such as those shown in FIG. 8A through FIG. 9B, for example.

It should be noted that the present invention is by no means restricted to the above embodiments.

The driving means for reciprocally driving the transporting member (blade 5) is not restricted to a combination of springs 8, an intermediate lever 13, and cam 17; rather, the intermediate lever 13 may be omitted so that the rear end of the blade 5 comes into direct contact with the perimeter of the cam 17. Also, a rack-and-pinion mechanism may be used instead of the cam, or other various types of mechanisms may be used. The driving source is not restricted to a rotational motion mechanism such as a motor, but may rather be a linear motion mechanism instead.

In the above embodiments, friction owing to difference in speed between the transporting member (blade) and parts was used as the method for transporting the parts in one direction, but instead, a mechanism may be provided at the rear of the guiding groove, for example, in order to prevent the parts from moving backwards. The mechanism for preventing backwards movement may employ the difference in angle between the above chute 21 and guiding groove 6, or a mechanism may be separately provided which acts to hold the parts only when the transporting member is moving backwards. In this case, the holding mechanism is released at the time of the transporting member advancing, so the parts move forwards on the transporting member, but the holding mechanism holds the sides of the parts at the time of the transporting member retracting, thereby preventing the parts from moving forwards.

Also, the synchronizing means 32 is not restricted to such which opens and closes the stopper 31 in a manner directly synchronous with the movement of the blade (transporting member) 5; rather, a separate transmitting member for transmitting the movement of the cam 17 to the stopper 17 may be provided instead, for example. Or, in the event that the driving means is comprised of a mechanism other than a cam, this driving means may be driven synchronously with the stopper.

In the above embodiments, the second part $P_2$ is held between the tip portion 31c of the stopper 31 and the inner face of the guiding groove 6, but a pair of stoppers 31 capable of opening and closing may be provided on either side of the guiding groove 6, so as to hold the second part $P_2$ between these stoppers 31.

Further, neither is the transporting member restricted to a blade; rather, any material capable of forming the bottom of the guiding groove and moving forwards and backwards may be used. It should be noted, however, that a thin member such as a blade is advantageous in that the weight thereof can be reduced, thereby reducing the effects of inertia in the reciprocal movement.

Also, parts which can be transported by the present invention are not limited to square chips; rather, any sort of parts may be transported as long as the parts are capable of being arrayed in one row and transported through the guiding groove.

As can be clearly understood from the above description, with the apparatus for transporting parts according to the present invention, parts are transported forwards along a guiding groove by a reciprocally driven transporting member, and a stopper holds the second part in the row, following which the transporting member is further move forwards, whereby the first part in the row and the second part are separated. Accordingly, even non-magnetic members can be separated in a sure manner, and the shortcomings of the known method using magnetism can be overcome. Consequently, the first part can be easily extracted from the guiding groove. Also, the stopper opens and closes in a manner synchronous with the forward/backward movement of the transporting member, so the timing between the transporting member and the stopper can be easily synchronized, thereby realizing a transporting apparatus with high reliability.

What is claimed is:

1. A part transporting apparatus, comprising:
   a guiding groove for lining up parts in one row and guiding the parts, the guiding groove;
   a transporting member having a surface defining an upper plane thereon, which transporting member is provided at the base of the guiding groove and transports the parts in a forward direction by moving forwards and backwards along the groove;
   a driving means for reciprocally driving the transporting member in the forward and backward directions;
   a stopper that is movable so as to open and close relative to the guiding groove, and hold the second part from the front of the row of parts being transported on the upper plane of the transporting member; and a synchronizing means for opening and closing the stopper synchronously with the reciprocal forward and backward movement of the transporting member;

wherein, once the stopper holds the second part, the transporting member moves forward by a certain distance, thereby separating the first part in the row and the second part.

2. A part transporting apparatus according to claim 1, wherein the transporting member includes a tip portion, and wherein the synchronizing means comprises:

a first groove provided in a diagonal manner to the tip portion of the transporting member;

a second groove provided in a vertical manner on the inner surface of a fixing member for guiding the side of the transporting member;

a rolling member located in the first groove and in the second groove so as to straddle the space therebetween;

an inclined plane formed on the stopper, engageable with the rolling member; and a spring for pressing the stopper in the direction of holding parts;

wherein the rolling member moves vertically along the first and second grooves owing to the reciprocating action of the transporting member in the forward and backward directions, and the rolling member moves along the inclined plane provided to the stopper, so that the stopper reciprocally moves relative to the guiding groove, thereby holding the second part from the front of the row of parts.

3. A part transporting apparatus according to claim 2, wherein the stopper is a first stopper and is provided at a first side of the guiding groove, and further comprising a second stopper provided at another side of the guiding groove opposite the first side, the first and second stoppers reciprocally being movable relative to the guiding groove, thereby holding the second part from the front of the row of parts between the stoppers.

4. A part transporting apparatus according to claim 2, wherein the stopper is provided to one side of the guiding groove, and the stopper reciprocally moves relative to the guiding groove, thereby holding the second part from the front of the row of parts between the inner face of the guiding groove and the stopper.

5. A part transporting apparatus according to claim 1, wherein the synchronizing means comprises:

a contacting portion provided to the transporting member;

an inclined plane formed on the stopper, the inclined plane including a portion positioned to come into contact with the transporting member contacting portion in the forward and backward directions; and a spring for pressing the stopper in the direction of holding parts;

wherein the contacting portion moves along the inclined plane of the stopper owing to the reciprocating action of the transporting member in the forward and backward directions, so that the stopper reciprocally moves relative to the guiding groove, thereby holding the second part from the front of the row of parts.

6. A part transporting apparatus according to claim 5, wherein the stopper is provided to both sides of the guiding groove, and the stoppers reciprocally move relative to the guiding groove, thereby holding the second part from the front of the row of parts between the inner face of the guiding groove and the stopper.

7. A part transporting apparatus according to claim 5, wherein the stopper is provided to one side of the guiding groove, and the stopper reciprocally moves relative to the guiding groove, thereby holding the second part from the front of the row of parts between the inner face of the guiding groove and the stopper.

8. A part transporting apparatus according to claim 1, wherein the synchronizing means comprises:

an inclined plane provided on the transporting member in the forward and backward direction;

a contacting portion formed on the stopper, engageable with the inclined plane member; and a spring pressing for the stopper in the direction of holding parts;

wherein the stopper contacting portion moves over the inclined plane owing to the reciprocating action of the transporting member in the forward and backward directions, so that the stopper reciprocally moves relative to the guiding groove, thereby holding the second part from the front of the row of parts.

9. A part transporting apparatus according to claim 8, wherein the stopper is provided to one side of the guiding groove, and the stopper reciprocally moves relative to the guiding groove, thereby holding the second part from the front of the row of parts between the inner face of the guiding groove and the stopper.

10. A part transporting apparatus according to claim 8, wherein the stopper is a first stopper and is provided at a first side of the guiding groove, and further comprising a second stopper provided at another side of the guiding groove opposite the first side, the first and second stoppers reciprocally being movable relative to the guiding groove, thereby holding the second part from the front of the row of parts between the stoppers.

11. A part transporting apparatus according to claim 1, wherein the transporting member includes a tip portion, and wherein the synchronizing means comprises:

a first groove provided in a diagonal manner to the tip portion of the transporting member;

a second groove provided in a vertical manner on the inner surface of a fixing member for guiding the side of the transporting member; and a rolling member located in the first groove and in the second groove so as to straddle the space therebetween;

wherein the stopper is formed of a material having spring-like properties in the direction of holding parts;

and wherein the rolling member moves vertically along the first and second grooves owing to the reciprocating action of the transporting member in the forward and backward directions, and the rolling member moves along the inclined plane provided to the stopper, so that the stopper reciprocally moves relative to the guiding groove, thereby holding the second part from the front of the row of parts.

12. A part transporting apparatus according to claim 11, wherein the stopper is provided to one side of the guiding groove, and the stopper reciprocally moves relative to the guiding groove, thereby holding the second part from the front of the row of parts between the inner face of the guiding groove and the stopper.

13. A part transporting apparatus according to claim 11, wherein the stopper is a first stopper and is provided at a first side of the guiding groove, and further comprising a second stopper provided at another side of the guiding groove opposite the first side, the first and second stoppers reciprocally being movable relative to the guiding groove, thereby holding the second part from the front of the row of parts between the stoppers.

14. A part transporting apparatus according to claim 1, wherein the driving means is adapted to drive the transporting member in a reciprocal manner such that a speed of moving in the backward direction is greater than a speed of moving in the forward direction;

wherein the speed of moving in the forward direction is a speed at which holding friction acts between the transporting member and a part disposed upon the upper surface thereof;

and wherein the speed of moving in the backward direction is a speed at which the friction between the transporting member and a part disposed upon the upper surface thereof is essentially broken.

15. A part transporting apparatus according to claim 14, wherein the transporting member includes a tip portion, and wherein the synchronizing means comprises:

a first groove provided in a diagonal manner to the tip portion of the transporting member;

a second groove provided in a vertical manner on the inner surface of a fixing member for guiding the side of the transporting member;

a rolling member located in the first groove and in the second groove so as to straddle the space therebetween;

an inclined plane formed on the stopper, engageable with the rolling member; and a spring for pressing the stopper in the direction of holding parts;

wherein the rolling member moves vertically along the first and second grooves owing to the reciprocating action of the transporting member in the forward and backward directions, and the rolling member moves along the inclined plane provided to the stopper, so that the stopper reciprocally moves relative to the guiding groove, thereby holding the second part from the front of the row of parts.

16. A part transporting apparatus according to claim 14, wherein the synchronizing means comprises:

a contacting portion provided to the transporting member;

an inclined plane formed on the stopper, the inclined plane including a portion positioned to come into contact with the transporting member contacting portion in the forward and backward directions; and a spring for pressing the stopper in the direction of holding parts;

wherein the contacting portion moves along the inclined plane of the stopper owing to the reciprocating action of the transporting member in the forward and backward directions, so that the stopper reciprocally moves relative to the guiding groove, thereby holding the second part from the front of the row of parts.

17. A part transporting apparatus according to claim 14, wherein the synchronizing means comprises:

an inclined plane provided on the transporting member in the forward and backward direction;

a contacting portion formed on the stopper, engageable with the inclined plane member; and a spring pressing for the stopper in the direction of holding parts;

wherein the stopper contacting portion moves over the inclined plane owing to the reciprocating action of the transporting member in the forward and backward directions, so that the stopper reciprocally moves relative to the guiding groove, thereby holding the second part from the front of the row of parts.

18. A part transporting apparatus according to claim 14, wherein the transporting member includes a tip portion, and wherein the synchronizing means comprises:

a first groove provided in a diagonal manner to the tip portion of the transporting member;

a second groove provided in a vertical manner on the inner surface of a fixing member for guiding the side of the transporting member; and a rolling member located in the first groove and in the second groove so as to straddle the space therebetween;

wherein the stopper is formed of a material having spring-like properties in the direction of holding parts;

and wherein the rolling member moves vertically along the first and second grooves owing to the reciprocating action of the transporting member in the forward and backward directions, and the rolling member moves along the inclined plane provided to the stopper, so that the stopper reciprocally moves relative to the guiding groove, thereby holding the second part from the front of the row of parts.

\* \* \* \* \*